United States Patent
Chen et al.

(10) Patent No.: US 9,029,224 B2
(45) Date of Patent: May 12, 2015

(54) HIGH-K LAYERS, TRANSISTORS, AND FABRICATION METHOD

(71) Applicant: Semiconductor Manufacturing International Corp., Shanghai (CN)

(72) Inventors: Yong Chen, Shanghai (CN); Yonggen He, Shanghai (CN)

(73) Assignee: Semiconductor Manufacturing International Corp., Shanghai (CN)

( * ) Notice: Subject to any disclaimer, the term of this patent is extended or adjusted under 35 U.S.C. 154(b) by 62 days.

(21) Appl. No.: 13/736,093

(22) Filed: Jan. 8, 2013

(65) Prior Publication Data

US 2014/0042559 A1 Feb. 13, 2014

(30) Foreign Application Priority Data

Aug. 13, 2012 (CN) .......................... 2012 1 0287384

(51) Int. Cl.
| | |
|---|---|
| *H01L 21/336* | (2006.01) |
| *H01L 21/31* | (2006.01) |
| *H01L 21/469* | (2006.01) |
| *H01L 21/02* | (2006.01) |
| *H01L 29/78* | (2006.01) |
| *H01L 29/66* | (2006.01) |
| *H01L 21/314* | (2006.01) |
| *C23C 16/40* | (2006.01) |
| *C23C 16/455* | (2006.01) |
| *H01L 21/28* | (2006.01) |
| *H01L 29/51* | (2006.01) |
| *H01L 29/49* | (2006.01) |

(52) U.S. Cl.
CPC .......... *H01L 29/78* (2013.01); *H01L 29/66477* (2013.01); *H01L 21/3141* (2013.01); *H01L 21/02181* (2013.01); *H01L 21/02205* (2013.01); *H01L 21/0228* (2013.01); *C23C 16/405* (2013.01); *C23C 16/45553* (2013.01); *H01L 21/28194* (2013.01); *H01L 29/49* (2013.01); *H01L 29/517* (2013.01); *H01L 29/66575* (2013.01)

(58) Field of Classification Search
CPC ..... H01L 21/28; H01L 21/285; H01L 21/314; H01L 29/66477; H01L 21/3141; H01L 21/3142; H01L 21/31616; H01L 21/31637; H01L 21/31641; H01L 21/31645; H01L 21/28194; H01L 29/78; H01L 29/513; H01L 29/517; H01L 21/02205; C23C 16/45553; C23C 16/405
USPC .................. 257/410, 411, E21.267, E21.274, 257/E21.28, E21.281; 438/785, 591, 287, 438/240, 585
See application file for complete search history.

(56) References Cited

U.S. PATENT DOCUMENTS

| | | | |
|---|---|---|---|
| 8,012,824 B2 | 9/2011 | Yao et al. | |
| 2003/0003635 A1* | 1/2003 | Paranjpe et al. | ............. 438/149 |
| 2003/0176065 A1* | 9/2003 | Vaartstra | ...................... 438/688 |

(Continued)

*Primary Examiner* — Fernando L Toledo
*Assistant Examiner* — Aaron Gray
(74) *Attorney, Agent, or Firm* — Anova Law Group, PLLC

(57) ABSTRACT

A method is provided for fabricating a High-K layer. The method includes providing a substrate, applying a first precursor gas on the substrate such that the substrate absorbs first precursor gas molecules in a chemical absorption process, and removing the unabsorbed first precursor gas using a first inert gas. The method also includes applying a second precursor gas on the substrate, and forming a first thin film on the substrate as a reaction product of the second precursor gas and the absorbed first precursor gas molecules. Further, the method includes removing unreacted second precursor gas and byproducts using a second inert gas, and forming a high-K layer on the substrate by forming a plurality of the first thin films layer-by-layer.

13 Claims, 8 Drawing Sheets

(56) References Cited

U.S. PATENT DOCUMENTS

| | | | |
|---|---|---|---|
| 2004/0198069 A1* | 10/2004 | Metzner et al. | 438/785 |
| 2006/0138514 A1* | 6/2006 | Oh et al. | 257/306 |
| 2006/0252271 A1* | 11/2006 | Chau et al. | 438/707 |
| 2008/0286589 A1* | 11/2008 | Shero et al. | 428/472 |
| 2010/0098884 A1* | 4/2010 | Balseanu et al. | 427/577 |

* cited by examiner

HIGH-K LAYERS, TRANSISTORS, AND FABRICATION METHOD

CROSS-REFERENCES TO RELATED APPLICATIONS

This application claims the priority of Chinese patent application No. 201210287384.0, filed on Aug. 13, 2012, the entirety of which is incorporated herein by reference.

FIELD OF THE INVENTION

The present invention generally relates to the field of semiconductor manufacturing technology and, more particularly, relates to high-K dielectric layers and transistors and techniques for fabricating high-performance transistors.

BACKGROUND

With rapid development on the integrated circuit (IC) manufacturing technology, size of semiconductors in ICs, especially the size of the MOS (Metal-Oxide-Semiconductor) devices, continues to shrink in order to meet the requirements for the miniaturization and high-degree-integration circuits. As the size of the MOS transistor devices decreases continuously, the existing fabrication technology, which uses silicon oxide or silicon oxynitride as the gate dielectric layer, has been challenged. More particularly, transistors with silicon oxide or silicon oxynitride based gate dielectric layer may have certain problems, such as increased leakage current and impurity diffusion, which may affects the threshold voltage of the transistors. Thus, the performance of semiconductor devices based on such transistors may be impacted.

To solve these problems, transistors with high-K (dielectric constant)/metal gate structures have been introduced. By replacing the silicon oxide or silicon oxynitride gate dielectric materials with the high-K materials, the leakage current can be reduced while the size of the semiconductor devices decreases, and the performance of the semiconductor devices can be improved. Conventional $SiO_2$/poly silicon gate structures of complementary metal-oxide-semiconductor (CMOS) devices have been replaced by the high-K/metal gate structure since 45 nm technology node was used.

An atomic layer deposition (ALD) process is a common method for forming high-K dielectric layers. However, in respect the current ALD process for forming the high-K dielectric layers, the surface of the high-K dielectric layers formed by the ALD process may be rough, thus the performance of the transistors with these high-K dielectric layers may be impacted. The disclosed methods and systems are directed to solve one or more problems set forth above and other problems.

BRIEF SUMMARY OF THE DISCLOSURE

One aspect of the present disclosure includes a method for fabricating semiconductor structure with a high-K layer. The method includes providing a substrate, applying a first precursor gas on the substrate such that the substrate absorbs first precursor gas molecules in a chemical absorption process, and removing the unabsorbed first precursor gas using a first inert gas. The method also includes applying a second precursor gas on the substrate, and forming a first thin film on the substrate as a reaction product of the second precursor gas and the absorbed first precursor gas molecules. Further, the method includes removing unreacted second precursor gas and byproducts using a second inert gas, and forming a high-K layer on the substrate by forming a plurality of the first thin films layer-by-layer.

Another aspect of the present disclosure includes a transistor. The transistor includes a substrate, a source region and a drain region. The transistor also includes a gate stacking structure having an interfacial layer, a high-K gate dielectric layer formed by the disclosed method, a work function metal layer and gate metal layer. Further, the transistor includes a sidewall spacer surrounding the interfacial layer, the high-K gate dielectric layer, the work function metal layer and the gate metal layer.

Other aspects of the present disclosure can be understood by those skilled in the art in light of the description, the claims, and the drawings of the present disclosure.

DETAILED DESCRIPTION

Reference will now be made in detail to exemplary embodiments of the invention, which are illustrated in the accompanying drawings. Wherever possible, the same reference numbers will be used throughout the drawings to refer to the same or like parts.

A transistor with a high-K gate dielectric layer formed by the existing process may generate leakage current, the stability may be inadequate. The high-K dielectric layer formed by the existing process may have a relatively rough surface which causes the transistor with a high-K/metal gate structure to generate the leakage current.

Figure 1:
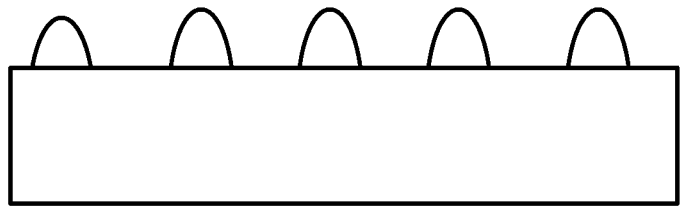
FIG. 1 illustrates an island-shape deposition structure of an existing process for forming a high-K layer.
Figure 2:
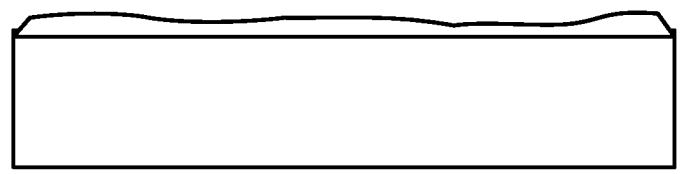
FIG. 2 illustrates a high-K layer formed on the island-shape deposition structure of the existing process for forming a high-K layer.

The rough surface of the high-K dielectric layer may be caused by an atomic layer deposition (ALD) process used to form the high-K dielectric layer. $H_2O$ or $O_3$ is often used as a precursor gas in the ALD process for forming the high-K dielectric layer. $H_2O$ or $O_3$ may be unable to form a saturated absorption on the surface of a substrate in a short period of time, and absorbed gas molecules may fall off, therefore gaps may be formed between the absorbed gas molecules. As shown in FIG. 1, when $H_2O$ or $O_3$ is used as the precursor gas of the ALD process, island deposition structures are formed because the initial gas molecule absorption is not quick enough and stable. After a plurality of more cycles of depositions, as shown in FIG. 2, a high-K dielectric layer is formed on the island deposition structures. The coverage ratio of the high-K dielectric layer may be low; the surface of the high-K dielectric layer may be uneven; and the dielectric layer may have defects. Therefore, a transistor with the high-K dielectric layer may generate leakage current, and the performance of the transistor may decrease.

In addition, A three-dimensional deposition may induce a lot of boundaries between the inlands. The boundary is the path of the leakage and breakdown. So a three-dimensional deposition degrades the gate dielectric quality.

Figure 19:
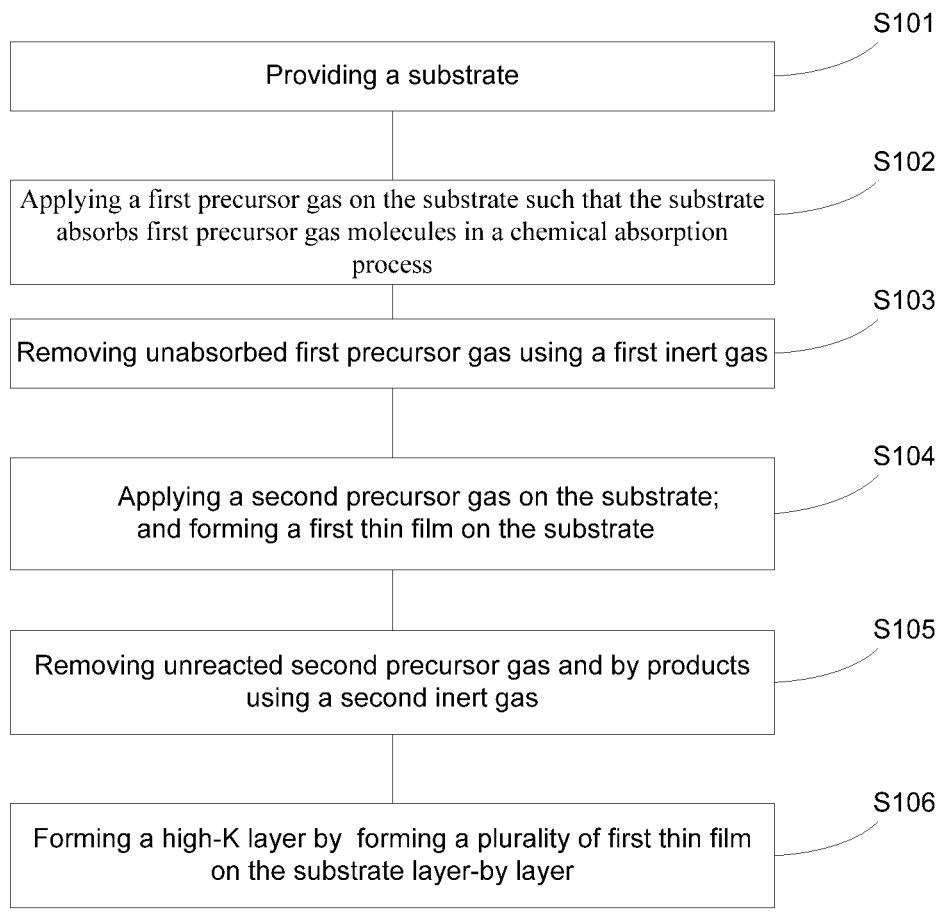
FIG. 19 illustrates an exemplary fabrication process for forming a high-K layer consistent with disclosed embodiments.

FIG. 19 illustrates an exemplary fabrication process for forming a high-K layer consistent with disclosed embodiments. FIGS. 3-8 illustrate exemplary semiconductor structures corresponding to certain stages of the exemplary fabrication process for forming a high-K layer consistent with the disclosed embodiments.

Figure 3:
FIGS. 3-8 illustrate exemplary semiconductor structures corresponding to certain stages of an exemplary fabrication process for forming a high-K layer consistent with the disclosed embodiments.

As shown in FIG. 19, at the beginning of the fabrication process, a substrate is provided (S101). FIG. 3 shows a corresponding structure.

As shown in FIG. 3, a substrate 100 is provided. The substrate 100 may include any appropriate type of semiconductor material, such as single crystal silicon, poly silicon, amorphous silicon, silicon germanium, carborundum, indium antimonide, lead telluride, indium arsenide, indium phosphide, gallium arsenide, gallium antimonide, alloy semiconductor, epitaxially grown materials, or silicon on insulator (SOI). The semiconductor substrate 100 may also include any appropriate material and intermediate semiconductor structures, i.e., certain structures may have already been formed on a bare substrate, including an integrated circuit or a part of a certain device, etc.

In one embodiment, the semiconductor substrate 100 is a multiple-stacked structure having a silicon substrate and a silicon oxide layer. The silicon oxide layer may be formed on the silicon substrate by any appropriate process, such as a chemical vapor deposition (CVD) process, a physical vapor deposition (PVD) process, a thermal oxidation process, or a chemical oxidation process, etc. In one embodiment, the silicon oxide layer may be formed by a thermal oxidation process. The substrate 100 may also provide a base for subsequent processes and structures.

Figure 4:
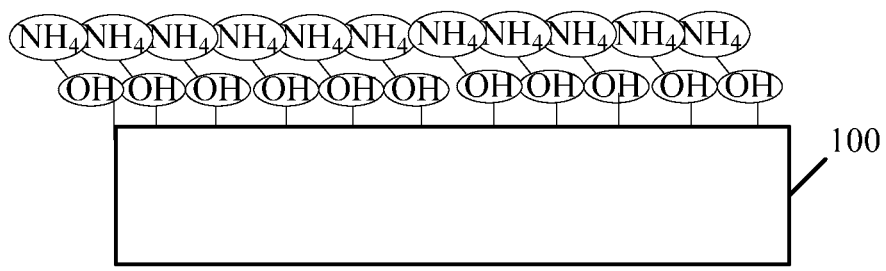

Returning to FIG. 19, after providing the substrate 100, a first precursor gas may be absorbed on the substrate 100 by a chemical absorption process (S102). FIG. 4 shows a corresponding structure.

The first precursor gas may be any appropriate chemical, such as $NH_4OH$, $NH_3/H_2O$, $O_2$, $O_3$, or $NH_4F$, etc. In one embodiment, the first precursor is $NH_4OH$. Specifically, the first precursor $NH_4OH$ may be transferred to one surface of the substrate 100 by a single pulse method using an inert gas as a carrier gas. $OH^-$ ions may be ionized from $NH_4OH$, and absorbed on the substrate 100, thus the surface of the substrate 100 may be activated. As shown in FIG. 4, the $OH^-$ ions may relatively easy to be ionized from $NH_4OH$, a saturated chemical absorption may be formed on the substrate 100 during a duration of the single pulse process, and $NH_4OH$ may exist on the substrate 100 as individual molecules.

In one embodiment, the carrier gas is an inert gas. The inert gas may include any one or more of nitrogen, argon, helium and neon. The inert gas may pass through a $NH_4OH$ solution, and $NH_4OH$ gas may be carried out by the inert gas as the first precursor gas. A concentration of the $NH_4OH$ solution may be in a range of approximately 10%~50%. A gas flow of the inert gas may be in a range of approximately 1 sccm~100 sccm. A duration of the single pulse may be in a range of approximately 0.05 s~5 s. When the inner gas passes through the $NH_4OH$ solution, volatilization of the $NH_4OH$ gas may be enhanced, and the $NH_4OH$ gas may be diluted. Therefore, the $NH_4OH$ gas carried by the inert gas may be uniformly transferred to the surface of the substrate 100, and help to form an uniform chemical absorption on the surface of the substrate 100.

In another embodiment, $NH_4OH$ gas may be formed by a reaction of $NH_3$ and $H_2O$ vapor, an inert gas may be introduced simultaneously. The inert gas may include any one or more of nitrogen, argon, helium and neon. A gas flow of $NH_3$ may be in a range of approximately of 1 sccm~100 sccm. A flow rate of $H_2O$ vapor may be in a range of approximately 1 sccm~100 sccm. A gas flow of the inert gas may be in a range of approximately 1 sccm~200 sccm. $H_2O$ content of the first precursor may be reduced using the $NH_4OH$ gas formed by the reaction of $NH_3$ and $H_2O$, the quality of the absorption of the first precursor on the substrate 100 may be ensured. The $NH_4OH$ gas may be diluted by the inert gas, the mixture gas of the $NH_4OH$ gas and the inert gas may be uniformly transferred to the surface of the substrate 100, and an uniform chemical absorption may be formed.

Figure 5:
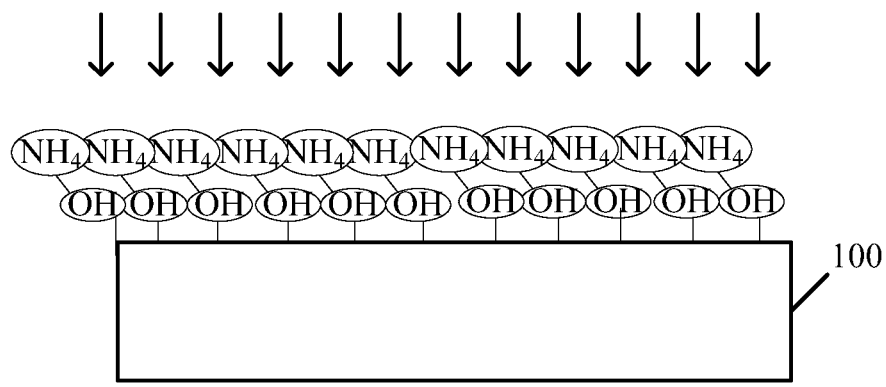

Returning to FIG. 19, after absorbing the first precursor gas on the substrate 100, the unabsorbed first precursor gas may be removed by a first inert gas (S103). FIG. 5 shows a corresponding structure.

The first inert gas may include any one or more of nitrogen, argon, helium and neon. As shown in FIG. 5, the first inert gas and the unabsorbed precursor gas may be pumped away when the first inert gas is blowing the surface of the substrate 100. Because the first precursor gas may be excessively introduced, a certain amount of the first precursor gas may be left after a complete absorption on the surface of the substrate 100. Removing the unabsorbed first precursor gas may ensure that a chemical reaction may only happen on the surface of the substrate 100 after a second precursor gas is subsequently introduced. Therefore, product of the chemical reaction may only deposit on the surface of the substrate 100, thus the quality of the subsequently formed high-K layer may be ensured.

Figure 6:
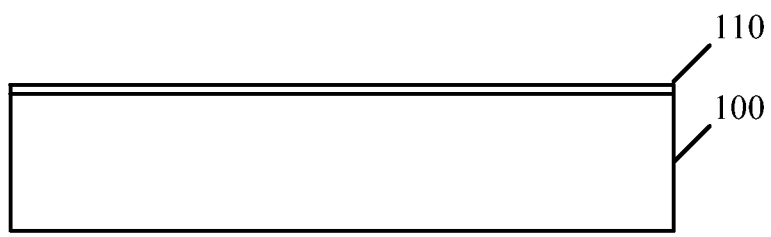

Returning to FIG. 19, after removing the unabsorbed first precursor gas, a first thin film may be formed on the substrate 100 (S104). FIG. 6 shows a corresponding structure.

As shown in FIG. 6, a first thin film 110 is formed on the substrate 100. The first thin film 110 may be formed by a chemical reaction of a second precursor gas and molecules of the first precursor gas absorbed on the substrate 100. The first thin film 110 may be an uniform and dense single atom layer. Any appropriate reaction condition, such as temperature, pressure, and gas flow, may be used to control the chemical reaction. The first thin film 110 may be made of one or more of $HfO_2$, $ZrO_2$, $Al_2O_3$, or $HfSiO_3$, etc. Other appropriate material may also include.

Because subsequently formed layer-by-layer films may be formed on the first thin film 110, quality of the first thin film 110 may impact quality of a finally formed high-K layer. Defects and/or non-uniform coverage of the first thin film 110 may cause the finally formed high-K layer to have defects, and/or a rough surface.

In one embodiment, a high coverage ratio and zero defect saturated absorption may be formed on the substrate 110 using the first precursor gas in a substantially short time period. Thus, the first thin film 110 with fever defects, a smooth surface, and a high coverage ratio may be formed by the reaction of the second precursor gas and the first precursor gas molecules absorbed on the substrate 100. The first thin film 110 may be a dense single atom layer, and atoms of the first thin film 110 may be densely packed with less defects. Therefore, subsequent layer-by-layer deposition on the first thin 110 may be performed on a smooth surface, and an island deposition may be unlikely to happen. Further, deposition rate of the first thin film 110 may be increased, and quality of formed thin films may be increased.

The second precursor gas may be one or more compounds, the compound may contain one or more metal of Hf, Zr, and Al. Other appropriate compound may also be used as the second precursor gas. In one embodiment, the second precursor is $HfCl_4$, thus the first thin film 110 is $HfO_2$.

Figure 7:
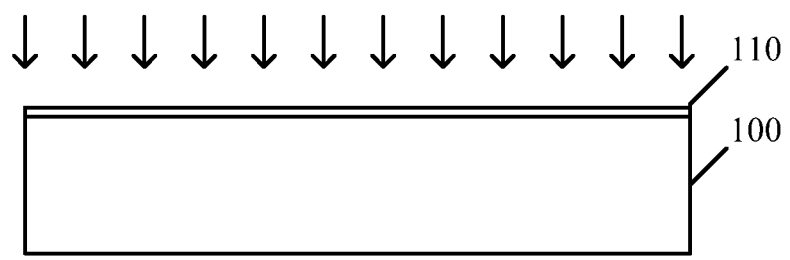

Returning to FIG. 19, after forming the first thin film 110, unreacted second precursor gas and byproducts may be removed by a second inert gas (S105). The corresponding structure is shown in FIG. 7. The byproducts may be formed by a reaction of the first precursor gas molecules absorbed on the substrate 100 and the second precursor gas.

The second inert gas may include any one or more of nitrogen, argon, helium, and neon. As shown in FIG. 7, the unreacted second precursor and the byproducts may be pumped away when the second inert gas is blowing the surface of the substrate. Molecules of the first precursor gas absorbed on the substrate 100 may be completely consumed when they reacts with the second precursor gas, and excessive amount of the second precursor gas and byproducts may exist after the reaction.

If the unreacted second precursor gas and the byproducts are not removed, when the first precursor gas is introduced again for a new cycle for forming another layer of material, the first precursor gas may react with the unreacted second precursor gas. It may be unable to form a stable chemical absorption. Further, the byproducts may become impurities in materials, and impact the quality of subsequently formed films. Therefore, removing the unreacted second precursor gas and the byproducts may ensure the first precursor gas introduced for subsequent layer-by-layer deposition process to only be absorbed on the surface the substrate 100 and/or previously formed layers.

Figure 8:
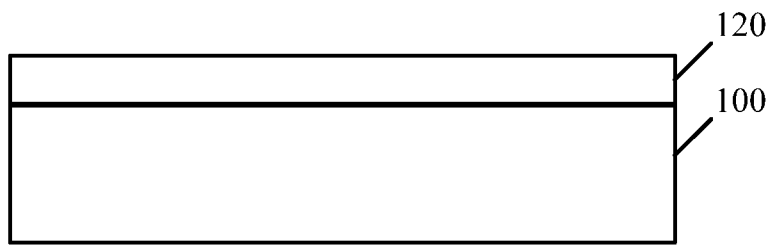

Returning to FIG. 19, after removing the unreacted second precursor, a high-K layer may be formed (S106). FIG. 8 shows a corresponding structure.

As shown in FIG. 8, a high-K layer 120 may be formed on the substrate 100, the first film 110 may be included in the high-K layer 120. The high-K layer 120 may be formed by a layer-by-layer deposition process. Specifically, the first precursor gas may be introduced to form a saturation absorption on the surface of the first thin film 110, followed by introducing the second precursor gas to react with the first precursor gas molecules absorbed on the first thin film 110 such that a second single atom layer may be formed on the single atom layer of the first thin film 110.

The process for forming the second single atom layer and/or the first single atom layer may be repeated by a plurality of times. Thus, reaction products of the first precursor gas and the second precursor gas may continuously be deposited as single atom layers on previously formed layers, the thickness of the deposited film may continuously increase until the high-K layer 120 with a desired thickness is formed.

In one embodiment, the process for forming the single atom layer may be repeated approximately 20 times to 30 times, and the thickness of the $HfO_2$ high-K layer 120 may be approximately 20 Å. Any other desired thickness of the high-K layer 120 may be formed by repeating certain numbers of the process for forming a single atom layer (e.g., the thin film 110).

The first precursor gas and the second precursor gas may be introduced by a single pulse mode. A schematic graph of the single pulse mode is shown in FIG. 9.

Figure 9:
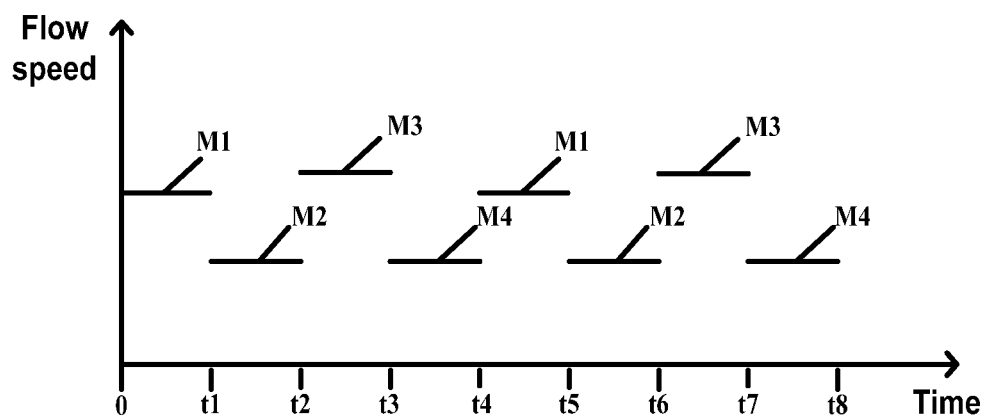
FIG. 9 illustrates a schematic of gas transfer pulses for forming a high-K layer consistent with the disclosed embodiments.

As shown in FIG. 9, M1 may refer to a transfer pulse of the first precursor gas. M2 may refer to a pulse for blowing the substrate 100 using the first inert gas. M3 may refer to a transfer pulse of the second precursor gas. M4 may refer to a transfer pulse for blowing the substrate 100 using the second inert gas. The first thin film 110 may be formed on the substrate 100 after a cycle of M1 to M4. Cycles of M1-M4 may be continuously repeated, single atom layers may be formed on the first film 110 by the layer-by-layer deposition process. When a desired thickness of the high-K layer 120 is formed, the pulses may be stopped.

The first precursor gas may be absorbed on the substrate 100 in a short period of time, thus a saturated absorption with a high coverage ratio and zero defects may be formed on the substrate 100. Therefore, when the first precursor molecules absorbed on the substrate 100 reacts with the second precursor gas, the first thin film 110 may be formed. The first thin film 110 may have a high coverage ratio, a smooth surface and fewer defects.

Further, the first thin film 110 may be a single atom layer, and atoms may be densely packed with fewer defects, which may ensure the subsequent layer-by-layer deposition to happen on a flat surface. Thus, island depositions may be prevented. Therefore, the obtained high-K layer 120 may have a high coverage ratio, a smooth surface and fewer defects. At the same time, because the initial island deposition may be prevented, a three-dimensional deposition may be prevented, deposition time may be decreased, and deposition efficiency may be increased. In addition, in one embodiment, if the first precursor gas is $NH_4OH$, the second precursor gas is $HfCl_4$, a byproduct of the reaction of the first precursor gas and the second precursor gas may be HCl. Because HCl may also react with $NH_4^-$ of the $NH_4OH$, the reaction rate may be further increased, and the deposition efficiency may also be increased.

Figure 10:
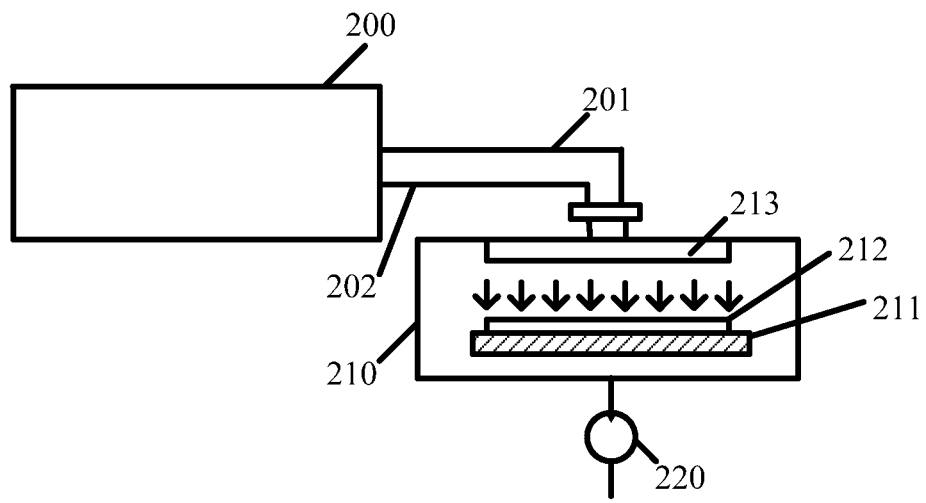
FIGS. 10-12 illustrate schematics of an ALD system for forming a high-K layer consistent with the disclosed embodiments.
Figure 11:
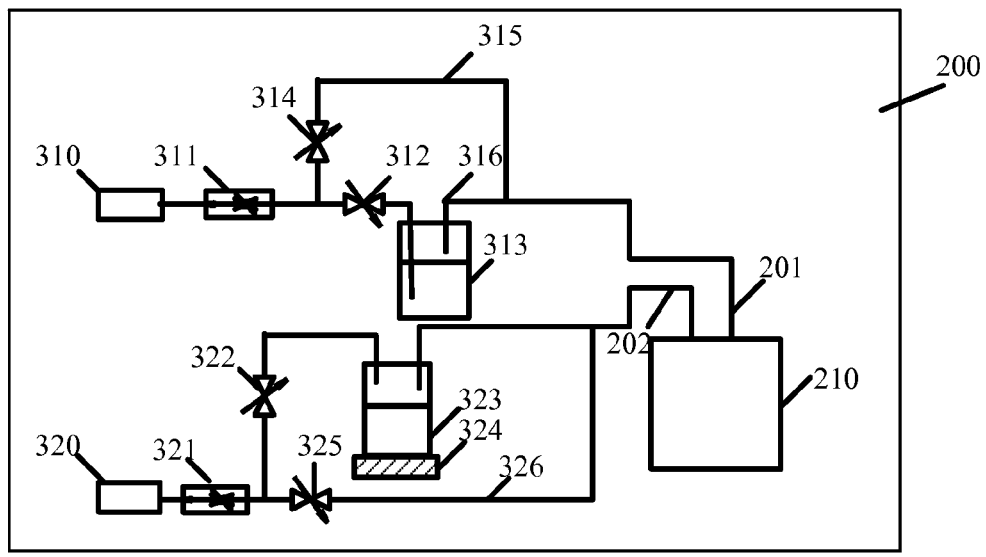
Figure 12:
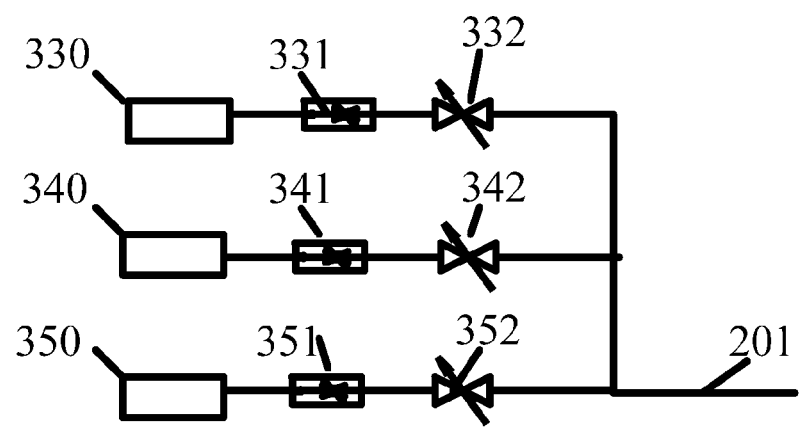

In another embodiment, an atomic layer deposition (ALD) system may be developed to implement the above disclosed processes and methods. FIGS. 10-12 show a corresponding system structure of the ALD system.

As shown in FIG. 10, the ALD system may include: an ALD reaction chamber 210 for providing a reaction environment; a gas supply system 200 for supplying reaction gases and assistant gases, the gas supply system may connect with the ALD reaction chamber 210 through a pipeline 201 and a pipeline 202; and an exhausting system 220 locating underneath the ALD reaction chamber 210 for exhausting gases out the ALD reaction chamber 210. Other appropriate component may be also built in the ALD system.

The ALD reaction chamber 210 may include: a heating system 211 located at the bottom of the ALD reaction chamber 210 for supporting a substrate 212 and heating the substrate 212; and a spray nozzle 213 having multiple spray holes locating over the substrate 212 in the ALD reaction chamber 210, which may cause gases to uniformly spread on the surface of the substrate 212. The spray nozzle 213 may connect with the gas supply system 200 through the pipeline 201 and the pipeline 202. The spray nozzle 213 and the exhausting system 220 may be perpendicular to the substrate 212, a gas flow of introduced gases may blow the substrate 212 vertically. Other appropriate component may also be built in the ALD chamber 210.

In certain other embodiments, the spray nozzle 213 and the exhausting system 220 may be parallel to the substrate 212, a gas flow of introduced gases may flow over the surface of the substrate 212 parallel.

As shown in FIG. 11, the gas supply system 200 may include: a first inert gas source 310 and a second inert gas source 320 located at one side of the gas supply system 200 for supplying inert gases to the entire ALD system; a first precursor source 313 located at the middle of the gas supply system 200 for supplying the first precursor gas of a deposition process; a pipeline 316 connecting with the first precursor gas source 313 and the pipeline 201; a mass flow controller (MFC) 311 and an valve 312 connecting the first inner gas source 310 with the first precursor gas source 313; a second precursor gas source 323 located in the middle of the gas supply system 200 and connecting with the pipeline 202; a heating system 324 underneath the second precursor gas source 323 together for supplying the second precursor gas; and a mass flow controller (MFC) 321 and an valve 322 connecting with the second inner gas source 320 and the second precursor gas source 323. The gas supply system 200 may also include: an valve 314 and a pipeline 315 connecting the MFC 311 with the pipeline 201; and an valve 325 and a pipeline 326 connecting the MFC 321 with the pipeline 202. Other appropriate components may also be included in the gas supply system 200, and other appropriate pipeline design may also be used in the gas supply system 200.

In one embodiment, the first inert gas source 310 and the second inert gas source 320 may be both $N_2$. In certain other embodiments, the first inert gas source 310 and the second inert gas source 320 may be different, and may include one or more of nitrogen, argon, helium and neon.

In one embodiment, the first precursor gas source 313 may be an $NH_4OH$ solution, and concentration of the $NH_4OH$ solution may be in a range of approximately 10%~50%. The second precursor gas source 323 may be an $HfCl_4$ gas. The $HfCl_4$ gas may be formed by heating solid $HfCl_4$ using the heating system 324 to cause the solid $HfCl_4$ to sublime. In certain other embodiments, if the second precursor gas source is a non-solid material, the heating system 324 may be optional.

In other embodiments, the first inert gas source 310 and the second inert gas source system 320 may be merged into one system. The inert gas from a single gas source system may be divided into two different pipelines, and used as carrier gases of the first precursor gas and the second precursor gas, respectively. The inert gas may also be used to blow the unreacted precursor gases. Thus, control of the ALD system may be simplified.

The ALD system may be used to implement a fabrication process for forming a high-K layer. For example, at the beginning of the fabrication process, the substrate 212 is provided. Referring to FIGS. 10-11, all the valves including the valve 311, the valve 312, the valve 314, the valve 321, the valve 322, the valve 325 may be closed, the ALD reaction chamber 210 may be kept clean.

The ALD reaction chamber 210 may be kept under high vacuum if it is not in use and/or before loading substrates. The substrate 212 may be loaded into the reaction chamber 210, and mounted on the heating system 211. After pumping up the ALD reaction chamber 210 to a certain vacuum level, the substrate 212 may be heated up to a certain temperature in range of approximately 100° C.~400° by adjusting the heating system 211. A pressure of the ALD reaction chamber 210 may be set in a range of approximately 1 Torr~20 Torr.

After providing the substrate 212, the first precursor gas may be absorbed on the substrate 212 by a chemical absorption process. Referring to FIGS. 10-11, the valve 312 connecting with the first inert gas source 310 may be turned on to transfer the first inert gas by the single pulse mode. A duration of the single pulse may be set in a range of approximately 0.05 s~5 s. A gas flow may be controlled in a range of approximately 1 sccm~200 sccm by the MFC 311. When nitrogen ($N_2$) is used as the first inert gas, $N_2$ may carry the gas phase $NH_4OH$ from the $NH_4OH$ solution when $N_2$ passes through the first precursor source 313. The $NH_4OH$ gas may be introduced into the ALD reaction chamber 210 through the pipeline 316, the pipeline 201 and the spray nozzle 213. The $NH_4OH$ gas may completely fill the ALD reaction chamber 210, and fully contact with the substrate 212, a saturated chemical absorption may be formed on the substrate 212.

In certain other embodiments, $NH_4OH$ gas may be formed by a reaction of $NH_3$ and $H_2O$ vapor, and the $NH_4OH$ gas may be diluted by an inert gas. As shown in FIG. 12, an alternative gas supply system may used. The alternative gas supply system may include: a first inert gas source 330, a $NH_3$ source 340 and a $H_2O$ vapor source 350. The first inert gas source 330 may connect with the pipeline 201 through a mass flow controller (MFC) 331 and an valve 342. The $NH_3$ source 340 may connect with the pipeline 201 through a mass flow controller (MFC) 341 and an valve 342. The $H_2O$ vapor source 350 may connect with the pipeline 201 through a mass flow controller (MFC) 351 and an valve 352.

The valve 332, the valve 342 and the valve 352 may be open simultaneously to transfer $N_2$, $NH_3$ and $H_2O$ vapor from the $N_2$ source 330, the $NH_3$ source 340 and the $H_2O$ vapor source 350 by pulsed modes. A duration of a pulse may be set in a range of approximately 0.05 s~5 s. A gas flow of the $N_2$ may be controlled in a range of approximately 1 sccm~200 sccm by the MFC 331. A gas flow of the $NH_3$ may be controlled in a range of approximately 1 sccm~100 sccm by the MFC 341. A gas flow of the $H_2O$ vapor may be controlled in a range of approximately 1 sccm~100 sccm by the MFC 351. The $NH_4OH$ gas may be formed by mixing the $NH_3$ and the $H_2O$ vapor, and the $N_2$ may be used as a carrier gas. The $N_2$ may also be used to dilute the $NH_4OH$ gas to make gases introduced into the ALD reaction chamber 210 have a uniform concentration. The $NH_4OH$ gas carried into the ALD reaction chamber 210 by the $N_2$ may fully contact with the substrate 212, and a saturated chemical absorption may be formed on the semiconductor substrate 212.

After the $NH_4OH$ being absorbed on the substrate 212, unabsorbed first precursor gas may be blown away by the first inert gas. Referring to FIGS. 10-11, the valve 312 may be turned off, and the valve 314 may be turned on, the $N_2$ inert gas may be transferred from the first inert gas source 310 to the ALD reaction chamber 210 by a pulse mode. A duration of the pulse may be set in a range of approximately 0.05 s~5 s. A gas flow of the $N_2$ may be controlled in a range of approximately 1 sccm~100 sccm by the MFC 311. The $N_2$ may be transferred to the ALD reaction chamber 210 through the pipeline 315, the pipeline 201 and the spray nozzle 213 by the pulse mode. The $N_2$ may blow inner surface of the ALD reaction chamber 210 and the surface of the substrate 212, the exhausting system 220 may pump out all gases in the ALD reaction chamber 210. Therefore unabsorbed excessive amount of the $NH_4OH$ may be blown away and pumped out the ALD reaction chamber 210, the ALD reaction chamber 210 may be kept clean.

After blowing away the unabsorbed first precursor gas, the second precursor gas may be introduced into the ALD reaction chamber, the second precursor gas may react with the first precursor gas molecules absorbed on the substrate 212 and form a first thin film. Referring to FIGS. 10-11, the valve 314 may be turned off, and the valve 322 may be turned on, the second inert gas $N_2$ may be transferred from the second inert gas source 320 to the second precursor gas source 323 by a pulse mode. A duration of the pulse may be set in a range of approximately 0.05 s~5 s. A gas flow of the $N_2$ may be controlled in a range of approximately 1 sccm~200 sccm.

In one embodiment, the second precursor may be solid $HfCl_4$. The solid $HfCl_4$ may be heated by the heating system 324 to sublime, a gas state $HfCl_4$ may be formed in the second precursor gas source 323. When the $N_2$ passes through the second precursor source 323, the gas state $HfCl_4$ may be carried by the $N_2$, and used as a second precursor gas. The second precursor gas may be introduced into the ALD reaction chamber 210 through the pipeline 202 and the spray nozzle 213. The $HfCl_4$ may react with the $NH_4OH$ absorbed on the substrate 212 to form the first film. The first film may be a dense single atom layer, and byproducts, such as HCl and $NH_4Cl$, may be formed.

After forming the first thin film, unreacted second precursor gas and the byproducts may be removed by the second inert gas. Referring to FIGS. 10-11, the valve 322 may be turned off, and the valve 325 may be turned on, The second inert gas $N_2$ may be transferred from the second inert gas source 320 to the ALD reaction chamber 210 by a pulse mode. A duration of the pulse may be set in a range of approximately 0.05 s~5 s. A gas flow of the $N_2$ may be controlled in a range of approximately 1 sccm~100 sccm by the MFC 321. The $N_2$ may be introduced into the ALD reaction chamber 210 through the pipeline 201 and the spray nozzle 213, and blow the surface of the substrate 212. The exhausting system 220 may pump out all gases in the ALD reaction chamber 210. The unreacted second precursor gas and the byproducts including HCl and $NH_4OH$ may be blown away by the second inert gas, and pumped out the ALD reaction chamber 210 by the exhausting system 220, the ALD reaction chamber may be kept clean.

A layer-by-layer deposition process may be used to repeat the above mentioned processes to form a high-K layer with a desired thickness using the ALD system. The ALD system has simple components, and may be relatively easy to operate. A reaction may be precisely controlled by setting a timer. The first inert gas and the first precursor gas may both connect with the ALD reaction chamber 210 through the pipeline 201, and the second inert gas and the second precursor gas may both connect with the ALD reaction chamber 210 through the pipeline 202. Therefore, when the inert gas is used to blow the substrate 212 and the inner surface of the ALD reaction chamber 210, the residue gas in the pipeline 201 or the pipeline 202 may also be removed.

Thus the residue gas in the pipeline 202 or the pipeline 202 may be prevented being introduced into the ALD reaction chamber 210 before the precursor gases is introduced into the ALD reaction chamber 210, the residue gas in the pipeline 201 and the pipeline 202 may be unlikely to impact the quality of the subsequently formed thin films. In addition, the spray nozzle 213 in the ALD reaction chamber 210 may have multiple holes, the first inert gas, the first precursor gas, the second inert gas and the second precursor gas may be uniformly spread on the entire substrate 212, which may cause the first precursor gas to achieve a fast saturated absorption on the substrate 212. Further, the uniform spreading of gases may also cause the second precursor gas introduced into the ALD reaction chamber to react with the absorbed first precursor gas molecules simultaneously and uniformly, and the quality of the high-K layer may be improved. A high-K layer with a smooth surface, a high coverage ratio and less defects may be formed by the disclosed embodiments and the systems.

Figure 20:
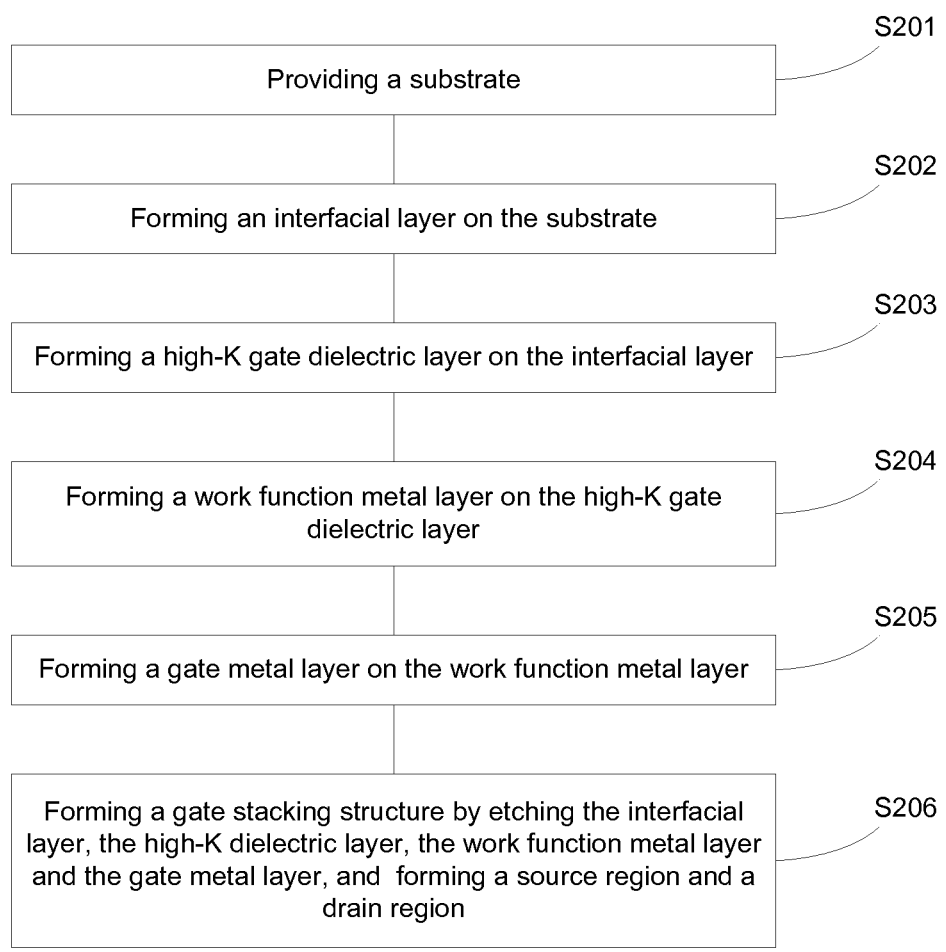
FIG. 20 illustrates an exemplary fabrication process for forming a transistor consistent with the disclosed embodiments.

FIG. 20 illustrates an exemplary fabrication process for forming a transistor, and FIGS. 13-18 illustrate exemplary semiconductor structures of the transistor corresponding to certain stages of the fabrication process.

Figure 13:
FIGS. 13-18 illustrate semiconductor structures corresponding to certain stages of an exemplary fabrication process for forming a transistor consistent with the disclosed embodiments.

As shown in FIG. 20, at the beginning of the fabrication process, a substrate is provided (S201). FIG. 13 shows a corresponding semiconductor structure.

As shown in FIG. 13, a substrate 400 is provided as a base for gate stacking structures and other structures. The substrate 400 may include any appropriate type of semiconductor material, such as single crystal silicon, poly silicon, amorphous silicon, silicon germanium, carborundum, indium antimonide, lead telluride, indium arsenide, indium phosphide, gallium arsenide, gallium antimonide, alloy semiconductor, epitaxially grown materials, or silicon on insulator (SOI). Other type of material may also be used as the substrate 400

Figure 14:
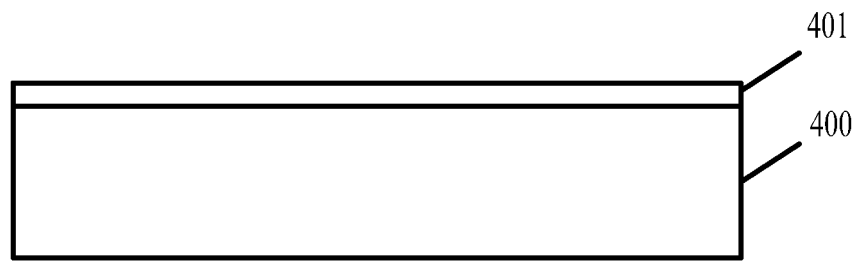

Returning to FIG. 20, after providing the substrate 400, an interfacial layer may be formed (S202). FIG. 14 shows a corresponding semiconductor structure.

As shown in FIG. 14, an interfacial layer 401 is formed on the substrate 400. The interfacial layer 401 may be made of any appropriate material, such as silicon oxide, silicon nitride, or silicon oxynitride, etc. Various processes may be used to form the interfacial layer 401, such as a chemical vapor deposition (CVD) process, a physical vapor deposition process (PVD), or a thermal oxidation process, etc. The interfacial layer 401 may be in between a subsequently formed high-K gate dielectric layer and the substrate 400. The interfacial layer 401 may provide a high quality interface between the substrate 400 and the high-K gate dielectric layer, and may also improve the interface characteristics between the substrate 400 and the high-K gate dielectric layer. In certain embodiments, the interfacial layer 401 may be omitted.

Figure 15:
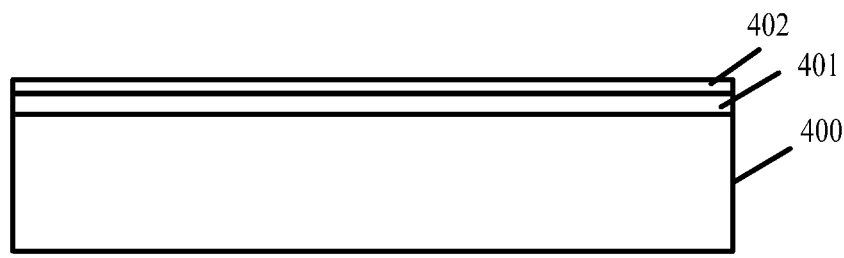

Returning to FIG. 20, after forming the interfacial layer 401, a high-K gate dielectric layer may be formed (S203). FIG. 15 shows a corresponding semiconductor structure.

As shown in FIG. 15, a high-K gate dielectric layer 402 is formed on the interfacial layer 401. The high-K gate dielectric layer 402 may be formed by the above disclosed method. The high-K gate dielectric layer 402 may be made of any one or more of $HfO_2$, $ZrO_2$, $Al_2O_3$ and $HfSiO_3$. The high-K dielectric gate dielectric layer 402 formed by the disclosed method may have a smooth surface and less defects, the quality of interface between the high-K gate dielectric layer 402 and a subsequently formed dielectric layer may be improved, defects from subsequent processes may reduced, and performance of the transistor may be enhanced.

Figure 16:
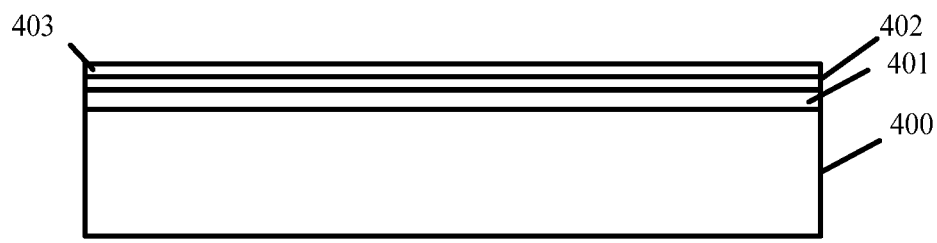

Returning to FIG. 20, after forming the high-K gate dielectric layer 402, a work function metal layer may be formed (S204). FIG. 16 shows a corresponding semiconductor structure.

As shown in FIG. 16, a work function metal layer 403 is formed on the high-K gate dielectric layer 402. The work function metal layer 403 may be formed by any appropriate process, such as a CVD process, or a PVD process, etc. The work function metal layer 403 may be made of any appropriate material, such as titanium nitride, thallium nitride, titanium aluminum alloy, or a combination thereof. For a PMOS transistor, materials with a relatively high work function may be used as the work function metal layer 403. For an NMOS transistor, materials with a relatively low work function may be used as the work function metal layer 403. The work function metal layer 403 may be used to modulate the work function of the transistor, lower threshold voltage, and lower power consumption.

Figure 17:

Returning to FIG. 20, after forming the work function metal layer 403, a gate metal layer may be formed (S205). FIG. 17 shows a corresponding semiconductor structure.

As shown in FIG. 17, a gate metal layer 404 is formed on the work function metal layer 403. The gate metal layer 404 may be formed by any appropriate process, such as a CVD process, or a PVD process, etc. The gate metal layer 403 may be made of any one of aluminum, copper, silver, gold, platinum, nickel, titanium, thallium, tantalum, tungsten, tungsten silicide, titanium tungsten alloy, titanium nitride, thallium nitride, thallium carbide, nickel platinum ally and thallium nitrate silicate, etc.

Figure 18:
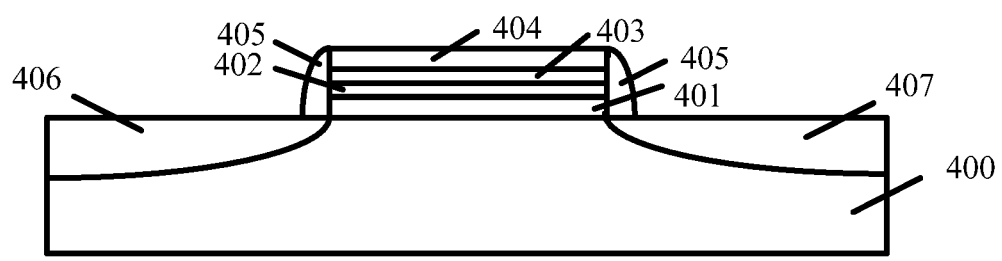

Returning to FIG. 20, after forming the gate metal layer 404, a gate stacking structure may be formed (S206). FIG. 18 shows a corresponding semiconductor structure.

As shown in FIG. 18, a gate stacking structure having the interfacial layer 401 on the substrate 400, the high-K gate dielectric layer 402, the work function metal layer 304 and the gate metal layer is formed. Various processes may be used to form the gate stacking structure. In one embodiment, the gate stacking structure may be formed by etching a portion of the gate metal layer 404, the work function metal layer 403, the high-K gate dielectric layer 402 and the interfacial layer 401 until the substrate 400 is exposed. Further, a sidewall spacer material layer may be formed to cover the gate stacking structure, followed by an etch back process to a sidewall spacer 405. The etching process may include a dry etching process, such as a reactive ion etching process or an ion bean etching process. Other appropriate etching processes may also be used to form the sidewall spacer 405. The sidewall spacer 405 may be made of any appropriate material, such as silicon oxide, silicon nitride, silicon oxynitride, or combination thereof.

After forming the gate stacking structure, a source region 406 and a drain region 407 may be formed in the substrate 400 at both sides of the gate stacking structure. Various fabrication methods may be used to form the source region 406 and the drain region 407.

In one embodiment, the method for forming the source region 406 and the source region 407 may include performing a light doping ion implantation on the semiconductor substrate 400 before forming the sidewall spacer 405 and after etching the gate metal layer 404, the work function metal layer 403, the high-K gate dielectric layer 402 and the interfacial layer 401 using the etched gate metal layer 404 as a mask.

Further, a heavy doping ion implantation process may be performed on the substrate 400 after forming the sidewall spacer 405 using the gate stacking structure as a mask. The region between the source region 406 and the drain region 407 may form a channel region of the transistor. The source region 406, the drain region 407 and the gate stacking structure on the channel region may form the transistor. If silicon germanium is used to form the source region 406 and the drain region 407, the source region 406 and the drain region 407 may be in situ doped. Any appropriate P-type ion or N-type ion may be used to dope the source region 406 and the drain region 407.

Defects caused by a rough surface of a high-K gate dielectric layer may cause every layer of a gate stacking structure to have defects, a leakage current of a subsequently formed transistor may be generated, and therefore quality of the high-K gate dielectric layer may significantly impact performance of the transistor. In the disclosed embodiments, the high-K gate dielectric layer 402 may be formed on the interfacial layer 401 using the disclosed method for forming the high-K layer. The quality of the high-K gate dielectric layer 402 may be improved, interface quality of the high-K gate dielectric layer 402 and the interfacial layer 401 may be improved, and interface quality of high-K gate dielectric layer 402 and the work function metal layer 403 may also be improved. Therefore, defects in the gate stacking structure may be decreased, the leakage current of the transistor may be decreased, and the stability and reliably of the transistor may be improved.

In another embodiment, a high-K layer for a semiconductor device may be formed by the above disclosed processes and methods, and the corresponding high-K layer of the semiconductor device is illustrated in FIG. 8. The structure includes the substrate 100 and the high-K layer 120 having a plurality of single atom layers.

In another embodiment, a transistor may be formed by the above disclosed processes and methods, and the corresponding transistor is illustrated in FIG. 18. The transistor includes a substrate 400, a source region 406 and a drain region 407. The transistor also includes a gate stacking structure having an interfacial layer 401, a high-K gate dielectric layer 402, a work function metal layer 403 and a gate metal layer 404. Further, the transistor includes a sidewall spacer 205 surrounding the interfacial layer 401, the high-K gate dielectric layer 402, the work function metal layer 403 and the gate metal layer 404 (i.e., the gate stacking structure). The detailed structures and intermediate structures are described above with respect to the fabrication methods It should be understood that the specification is described by exemplary embodiments, but it is not necessary that each embodiment includes an independent technical solution. Those skilled in the art can understand the specification as whole and technical features in the various embodiments can be combined into other embodiments understandable to those persons of ordinary skill in the art. Any equivalent or modification thereof, without departing from the spirit and principle of the present invention, falls within the true scope of the present invention.

What is claimed is:

1. A method for fabricating a semiconductor device with a high-K layer, comprising:

providing a substrate;

forming $NH_4OH$ gas by using an inert gas having a gas flow of approximately 1 sccm-100 sccm to dilute a mixture of $NH_3$ and $H_2O$ vapor, such that $NH_3$ reacts with $H_2O$ vapor to form the $NH_4OH$ gas;

passing an inert gas through a solution containing a first precursor comprising a first precursor molecule of the $NH_4OH$ gas to produce a first precursor gas comprising first precursor gas molecules volatilized and carried along with the inert gas to prepare a uniform transfer of the first precursor gas onto the substrate subsequently;

transferring the first precursor gas onto the substrate such that the substrate absorbs the first precursor gas molecules by a chemical absorption process to spread individual first precursor gas molecules on a surface of the substrate;

removing the unabsorbed first precursor gas using a first inert gas;

after transferring the first precursor gas and removing the unabsorbed first precursor gas, applying a second precursor gas on the substrate;

forming a first thin film on the substrate as a reaction product of the second precursor gas and the absorbed first precursor gas molecules;

removing unreacted second precursor gas and byproducts using a second inert gas; and forming a high-K layer on the substrate by forming a plurality of the first thin films layer-by-layer.

2. The method according to claim 1, wherein:

the first precursor gas, the first inert gas, the second precursor gas, and the second inert gas are transferred by a pulse mode sequentially.

3. The method according to claim 2, wherein:

the chemical absorption process allows a saturated chemical absorption of the first precursor gas molecules formed on the substrate during a period of the pulse mode, and the saturated chemical absorption of the first precursor gas molecules stably stays on the substrate after the chemical absorption process, the chemical absorption process comprising an ionic interaction between ionized first precursor gas molecules and the surface of the substrate.

4. The method according to claim 1, wherein:

the second precursor gas includes at least one compound containing one or more metal elements of Hf, Zr and Al.

5. The method according to claim 2, wherein:

gas flow of the first inert gas or the second inert gas is set in a range of approximately 1 sccm-100 sccm; and duration of a single pulse is set in a range of approximately 0.05 s-5 s.

6. The method according to claim 1, the removing the unabsorbed first precursor gas further includes:

blowing the surface of the substrate; and pumping out the unabsorbed first precursor gas simultaneously.

7. The method according to claim 1, wherein:

the first thin film is a dense single atom layer with a substantially smooth surface, an increased coverage ratio, and reduced defects, due to the chemical absorption process that spreads the individual first precursor gas molecules on the surface of the substrate.

8. The method according to claim 1, the removing the unreacted second precursor gas and the byproducts by the second inert gas further includes:

blowing the surface of the substrate absorbing the first precursor molecules; and pumping out the unreacted second precursor gas and the byproducts produced by the reaction of the first precursor gas molecules absorbed on the substrate and the second precursor gas simultaneously.

9. The method according to claim 1, wherein:

the first inert gas and the second inert gas are used to carry the first precursor gas and the second precursor gas by pulse modes, respectively.

10. The method according to claim 1, after forming the semiconductor substrate with a high-k layer, further including:

forming a gate metal layer on the high-K layer;

patterning the high-K layer and the metal gate layer to form a gate stacking structure;

forming a sidewall spacer surrounding the gate stacking structure; and forming a drain region and a source region.

11. The method according to claim 1, wherein:

the solution containing the first precursor comprises a $NH_4OH$ solution with a $NH_4OH$ concentration of approximately 10%-50%.

12. The method according to claim 1, wherein:

gas flow of $NH_3$ for forming the $NH_4OH$ gas is set in a range of approximately 1 sccm-100 sccm; and gas flow of $H_2O$ vapor for forming the $NH_4OH$ gas is set in a range of approximately 1 sccm-100 sccm.

13. The method according claim 1, wherein:

the first inert gas and the second inert gas are at least one or more of nitrogen, argon, helium and neon.

* * * * *